US012677477B2

(12) United States Patent    (10) Patent No.:   US 12,677,477 B2

Jain et al.    (45) Date of Patent:   Jul. 7, 2026

(54) AREA-EFFICIENT FULLY DEPLETED SEMICONDUCTOR-ON-INSULATOR STRUCTURE WITH MIXED THRESHOLD VOLTAGE TRANSISTORS

(71) Applicant: GlobalFoundries U.S. Inc., Malta, NY (US)

(72) Inventors: Navneet K. Jain, Milpitas, CA (US); Juhan Kim, Santa Clara, CA (US); Mahbub Rashed, Cupertino, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 495 days.

(21) Appl. No.: 18/482,107

(22) Filed: Oct. 6, 2023

(65) Prior Publication Data

US 2025/0120175 A1    Apr. 10, 2025

(51) Int. Cl.
| | |
|---|---|
| *H10D 84/90* | (2025.01) |
| *H03K 19/20* | (2006.01) |
| *H10D 84/82* | (2025.01) |
| *H10D 84/85* | (2025.01) |
| *H10D 86/00* | (2025.01) |

(52) U.S. Cl.
CPC ........... *H10D 84/907* (2025.01); *H10D 84/82* (2025.01); *H10D 84/859* (2025.01); *H10D 86/201* (2025.01); *H03K 19/20* (2013.01); *H10D 84/957* (2025.01)

(58) Field of Classification Search
CPC ........ H10D 84/85; H10D 84/82; H10D 84/90; H10D 84/903; H10D 84/907; H10D 84/957; H10D 84/859; H10D 86/01; H10D 86/201; H03K 19/20
See application file for complete search history.

(56) References Cited

U.S. PATENT DOCUMENTS

| | | | |
|---|---|---|---|
| 6,218,895 B1 | 4/2001 | De et al. | |
| 8,969,966 B2 | 3/2015 | Cheng et al. | |
| 9,536,880 B2 * | 1/2017 | Zhang | .................... H10D 86/01 |

(Continued)

OTHER PUBLICATIONS

European Search Report for corresponding EP Application No. 24168619.5-1001 dated Sep. 18, 2024, (GFPR-0170-EP), 6 pages.

(Continued)

*Primary Examiner* — Daniel D Chang

(74) *Attorney, Agent, or Firm* — David Cain; Hoffman Warnick LLC

(57)      ABSTRACT

Disclosed is a fully depleted semiconductor-on-insulator structure including a buried Nwell in a substrate below P-type and N-type well regions, an insulator layer on the substrate, and mixed threshold voltage transistors on the insulator layer above at least one of the well regions. An Nwell can be connected to receive a positive bias voltage with any NFET and any PFET above being a FBB LVT/ SLVT NFET and a RBB RVT/HVT PFET, respectively. A Pwell can be connected to receive another positive bias voltage less than the positive bias voltage on the Nwell with any NFET and any PFET above being a FBB RVT/HVT NFET and a RBB LVT/SLVT PFET, respectively. Additionally, or alternatively, a Pwell can be connected to receive a negative bias voltage with any NFET and any PFET above being a RBB RVT/HVT NFET and a FBB LVT/SLVT PFET, respectively.

20 Claims, 6 Drawing Sheets

(56) References Cited

U.S. PATENT DOCUMENTS

| | | | |
|---|---|---|---|
| 10,163,934 | B2 | 12/2018 | Hook et al. |
| 10,395,588 | B2 | 8/2019 | Ahmed et al. |
| 10,510,384 | B2 | 12/2019 | Bringivijayaraghavan et al. |
| 10,777,558 | B1 | 9/2020 | Kim |
| 11,004,878 | B2 | 5/2021 | Stamper et al. |
| 11,049,448 | B2 | 6/2021 | Knez et al. |
| 11,069,402 | B1 | 7/2021 | Jaiswal et al. |
| 12,035,061 | B2 | 7/2024 | Yamazaki et al. |
| 2001/0005159 | A1 | 6/2001 | Matsumoto |
| 2005/0116261 | A1 | 6/2005 | Van Der Zaag et al. |
| 2005/0157539 | A1 | 7/2005 | Van Der Zaag et al. |
| 2012/0001241 | A1 | 1/2012 | Park |
| 2012/0008031 | A1 | 1/2012 | Yamashita et al. |
| 2012/0292705 | A1 | 11/2012 | Cheng et al. |
| 2012/0306081 | A1 | 12/2012 | Ishizaki et al. |
| 2012/0313197 | A1 | 12/2012 | Chen et al. |
| 2013/0065366 | A1* | 3/2013 | Thomas ................. H10B 10/12 438/154 |
| 2014/0312423 | A1* | 10/2014 | Cheng ................. H10D 86/215 438/154 |
| 2014/0334227 | A1 | 11/2014 | Ueda |
| 2017/0324385 | A1* | 11/2017 | McKay ................... H03F 3/193 |
| 2017/0338274 | A1 | 11/2017 | Gancarz et al. |
| 2019/0114987 | A1 | 4/2019 | Li et al. |
| 2020/0295004 | A1 | 9/2020 | Kim |
| 2021/0264973 | A1 | 8/2021 | Jaiswal et al. |
| 2022/0198995 | A1 | 6/2022 | Ahmed |
| 2023/0029501 | A1 | 2/2023 | Wang et al. |
| 2023/0163134 | A1 | 5/2023 | Jain et al. |

OTHER PUBLICATIONS

U.S. Appl. No. 18/482,114, filed Oct. 6, 2023, (GFPR-0171-US), 48 pages.

European Search Report for corresponding EP Application No. 24168621.1-1211 dated Dec. 2, 2024, (GFPR-0171-EP), 11 pages.

U.S. Appl. No. 18/482,114, Notice of Allowance dated Nov. 6, 2024, (GFPR-0171-US), 10 pages.

* cited by examiner

AREA-EFFICIENT FULLY DEPLETED SEMICONDUCTOR-ON-INSULATOR STRUCTURE WITH MIXED THRESHOLD VOLTAGE TRANSISTORS

BACKGROUND

The present disclosure relates to fully depleted semiconductor-on-insulator structures and, more particularly, to embodiments of an area-efficient fully depleted semiconductor-on-insulator structure including mixed threshold voltage transistors.

Currently available fully depleted semiconductor-on-insulator (e.g., fully depleted silicon-on-insulator (FDSOI)) chip structures may include both a regular well area and a flip well area. These well areas are physically separated and each typically includes a P-type well region (Pwell) laterally surrounded by an N-type well region (Nwell) and aligned above a buried Nwell. Within the flip well area, P-channel field effect transistors (PFETs) are on an insulator layer above the Pwell and N-channel field effect transistors (NFETs) are on an insulator layer above the Nwell. In this case, the PFETs and NFETs are all low threshold voltage (LVT) or super low threshold voltage (SLVT) FETs that are only forward back biased (FBB) to avoid forward biasing of PN junctions between Pwells and adjacent Nwells. Within the regular well area, PFETs are on the insulator layer above the Nwell and NFETs are on the insulator layer above the Pwell. In this case, the PFETs and the NFETs are all regular threshold voltage (RVT) or high threshold voltage (HVT) FETs that are only reverse back biased (RBB) to avoid forward biasing of PN junctions between Pwells and adjacent Nwells. In such fully depleted semiconductor-on-insulator chip structures, the physical separation between the regular well and flip well areas and, particularly, physical separation between the buried Nwells thereof increases chip area consumption. Additionally, the limits on back biasing reduce design flexibility.

SUMMARY

Disclosed herein are embodiments of an area-efficient fully depleted semiconductor-on-insulator structure with mixed threshold voltage transistors and both forward and reverse back biasing options. The structure can include an insulator layer on a semiconductor substrate and multiple well regions in the semiconductor substrate adjacent to the insulator layer. The well regions can include an Nwell and a Pwell laterally surrounded by the Nwell. The structure can further include an additional Nwell (also referred to herein as a buried Nwell) in the semiconductor substrate below the multiple well regions. The structure can further include P-channel and N-channel field effect transistors on the insulator layer above at least one of the multiple well regions. In the structure, the Nwell can be electrically connected to receive a first bias voltage and the Pwell can be electrically connected to receive a second bias voltage that is lower than the first bias voltage.

In some embodiments, the structure can include an insulator layer on a semiconductor substrate and multiple well regions in the semiconductor substrate adjacent to the insulator layer. The well regions can include an Nwell and a Pwell laterally surrounded by the Nwell. The structure can further include an additional Nwell in the semiconductor substrate below the multiple well regions. The structure can further include rows of field effect transistors on the insulator layer. These rows can include, above each well region, a row of P-channel field effect transistors and a row of N-channel field effect transistors. In the structure, the Nwell can be electrically connected to receive a first bias voltage and the Pwell can be electrically connected to receive a second bias voltage that is lower than the first bias voltage.

In some embodiments, the structure can include an insulator layer on a semiconductor substrate and multiple well regions in the semiconductor substrate adjacent to the insulator layer. The multiple well regions can include alternating Nwells and Pwells. Furthermore, at least one of the well regions (e.g., an Nwell and/or a Pwell) includes an extension extending laterally from that well region into an adjacent well region with the opposite conductivity. The structure can further include an additional Nwell in the semiconductor substrate below the multiple well regions. The structure can further include rows of N-channel field effect transistors and P-channel field effect transistors on the insulator layer above the Nwells and the Pwells, respectively. Furthermore, given the extension(s), a row of N-channel field effect transistors includes at least one N-channel field effect transistor on the insulator layer above a P-type extension of a Pwell and/or a row of P-channel field effect transistors includes at least one P-channel field effect transistor on the insulator layer above an N-type extension of an Nwell. In this structure, the Nwells and any N-type extension thereof are electrically connected to receive a first bias voltage and the Pwells and any P-type extension thereof are electrically connected to receive a second bias voltage that is lower than the first bias voltage.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which.

DETAILED DESCRIPTION

Figure 1:
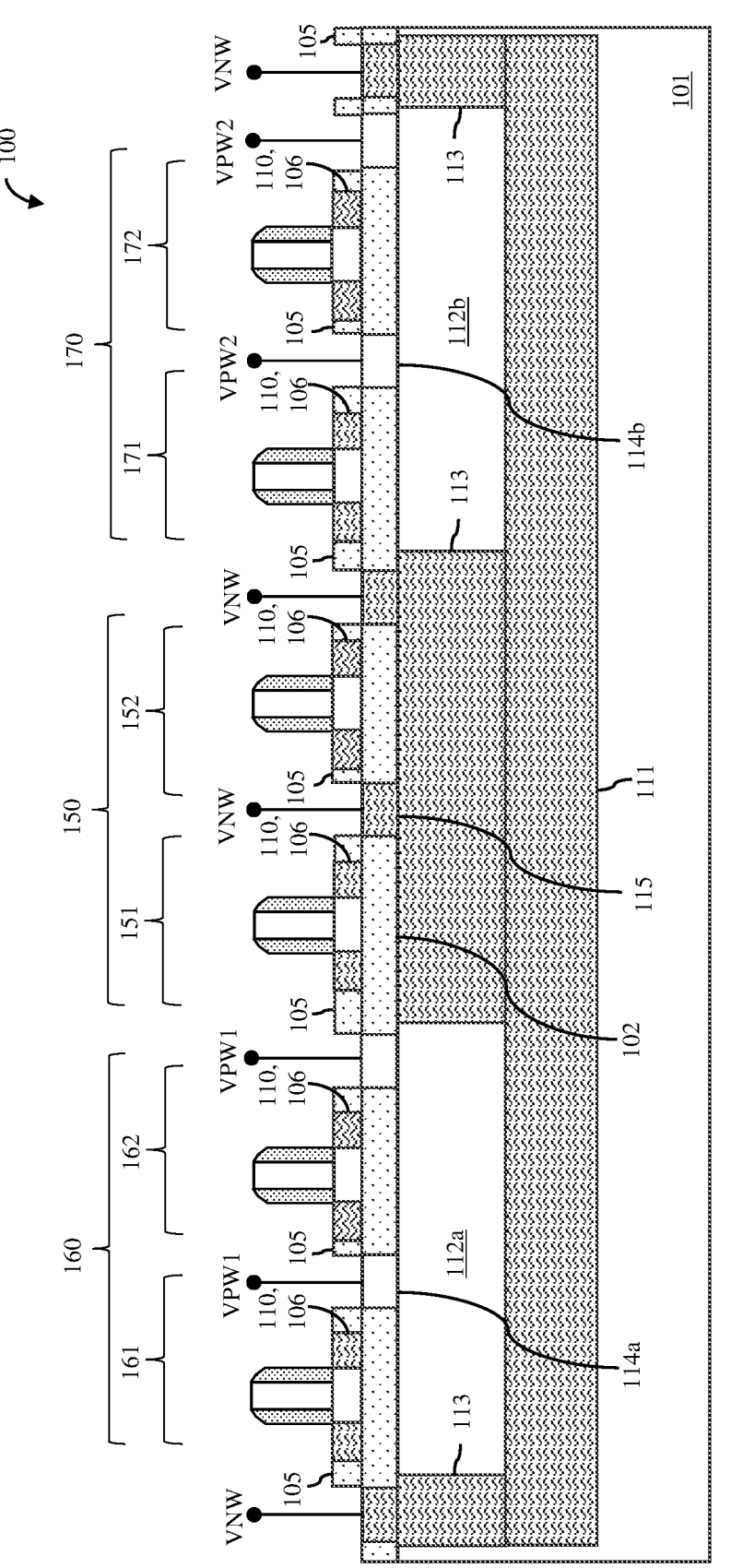
FIG. 1 is a cross-section diagram illustrating a disclosed embodiment of a semiconductor-on-insulator structure.

As mentioned above, currently available fully depleted semiconductor-on-insulator (e.g., FDSOI) chip structures may include both a regular well area and a flip well area. In a flip well area, PFETs are formed on an insulator layer above a Pwell such that they are LVT or SLVT PFETS and NFETs are formed on the insulator layer above an Nwell such that they are LVT or SLVT NFETs. Those skilled in the art will recognize that whether the FETs are SLVT or LVT FETs or whether they are RVT or HVT FETs will depend upon the design (e.g., device size, etc.) and process specifications (e.g., dopant concentrations, etc.). It should be understood that the designations in the description below and in the figures as LVT/SLVT and RVT/HVT refer LVT or SLVT FETs and RVT or HVT FETs, respectively. In any case, within the flip well area, a Pwell is laterally surrounded by the Nwell and both the Pwell and the Nwell are formed above the same buried Nwell. In a regular well area, PFETs are formed on the insulator layer above an Nwell such that they are RVT/HVT PFETS and NFETs are formed on the insulator layer above a Pwell such that they are RVT/HVT NFETs. The Pwell is again laterally surrounded by the Nwell and both the Pwell and the Nwell are formed above the same buried Nwell (which is physically separated from and, particularly, isolated from the buried Nwell of the regular well area). Those skilled in the art will recognize that in fully depleted semiconductor-on-insulator processing technology platforms (e.g., FDSOI processing technology platforms) FETs can be either forward back biased (FBB) or reverse back biased (RBB) by applying a particular bias voltage to the well region below the FET. FBB refers to applying a gate bias voltage to the well region to reduce the VT of the FET, thereby increasing the switching speed. For PFETs, FBB is achieved with the application of a negative bias voltage, whereas, for NFETs, FBB is achieved with the application of a positive bias voltage. RBB refers to applying a gate bias voltage to the well region below the FET to increase the VT of the FET, thereby reducing the switching speed. For PFETs, RBB is achieved with the application of a positive bias voltage, whereas, for NFETs, RBB is achieved with the application of a negative bias voltage.

In the currently available semiconductor-on-insulator chip structures, as described above, such back biasing is limited by the layout and particularly by PN junctions between the Pwell and adjacent Nwells (to the side and below) in both the regular well and flip well areas. If the Pwell is biased with a positive bias voltage and the adjacent Nwells are biased with a negative bias voltage, PN junctions will be forward biased (i.e., conductive), thereby shorting the devices to each other and to the lower portion of the substrate. Thus, the Pwell can only be biased with a Pwell voltage (VPW) of 0.0 volts (V) or a negative bias voltage and the Nwell can only be biased to an Nwell voltage (VNW) of 0.0V or a positive bias voltage. In the flip well area, a VPW of 0.0V or a negative bias voltage to the Pwell below the PFETs and a VNW of 0.0V or a positive bias voltage to the Nwell below the NFETs will result in the PFETS and the NFETs being ZB or FBB. In the regular well area, a VPW of 0.0V or a negative bias voltage to the Pwell below the NFETs and a VNW of 0.0V or a positive bias voltage to the Nwell below the PFETs will result in the PFETS and the NFETs being ZB or RBB. In such chip structures, physical separation of the regular well and flip well areas and, particularly, physical separation between the buried Nwells thereof increases chip area consumption. Additionally, the limits on back biasing reduce design flexibility.

In view of the foregoing, disclosed herein are embodiments of an area-efficient fully depleted semiconductor-on-insulator structure (e.g., an area-efficient FDSOI structure) with mixed threshold voltage transistors and both forward and reverse back biasing options. The structure can include a buried Nwell in a substrate below P-type and N-type well regions, an insulator layer on the substrate, and mixed threshold voltage transistors (e.g., at least an LVT/SLVT FET and an RVT/HVT FET) on the insulator layer above at least one well region. In the structure, an Nwell can be electrically connected to receive a positive bias voltage and, as a result, any NFET and PFET on the insulator layer above the Nwell will be a FBB LVT/SLVT NFET and a RBB RVT/HVT PFET, respectively. Optionally, the structure can include a NAND gate above the Nwell with series-connected FBB LVT/SLVT NFETs electrically connected to parallel-connected RBB RVT/HVT PFETs for optimal performance. In the structure, a Pwell can be electrically connected to receive a positive bias voltage that is less than the positive bias voltage on the Nwell and, as a result, any NFET and any PFET on the insulator layer above the Pwell will be a FBB RVT/HVT NFET and a RBB LVT/SLVT PFET, respectively. Additionally, or alternatively, a Pwell can be electrically connected to receive a negative bias voltage and, as a result, any NFET and any PFET on the insulator layer above this Pwell will be a RBB RVT/HVT NFET and a FBB LVT/SLVT PFET, respectively. In either case, reverse biasing of the PN junctions between the Pwell and Nwells in the semiconductor substrate is maintained. Optionally, the structure can include an NOR gate above this Pwell with series-connected FBB LVT/SLVT PFETs electrically connected to parallel-connected RBB RVT/HVT NFETs for optimal performance.

More particularly, referring to FIG. 1, disclosed herein are embodiments of a semiconductor-on-insulator structure 100 (hereinafter structure 100), such as a fully depleted semiconductor-on-insulator structure (e.g., a fully depleted silicon-on-insulator (FDSOI) structure). The structure 100 can include a semiconductor substrate 101. The semiconductor substrate 101 can be, for example, a monocrystalline silicon substrate or a substrate of any other suitable monocrystalline semiconductor material (e.g., silicon germanium, etc.). The semiconductor substrate 101 can have a bottom surface and a top surface opposite the bottom surface.

The semiconductor substrate 101 can further include multiple well regions 113, 112a, and 112b within and adjacent the top surface of the semiconductor substrate 101. For purposes of this disclosure, a well region refers to a region of semiconductor material doped (e.g., via a dopant implantation process or any other suitable doping process) so as to have a particular conductivity type. The well regions can include, for example, one or more P-type well regions (Pwells) 112a, 112b and an N-type well region (Nwell) 113 laterally surrounding each Pwell 112a, 112b in an upper portion of the semiconductor substrate 101 (e.g., at a top surface of the semiconductor substrate 101).

The semiconductor substrate 101 can further include a buried Nwell 111 below the multiple well regions 112a, 112b, and 113 and above a lower portion of the semiconductor substrate 101 (e.g., some distance from a bottom surface of the semiconductor substrate 101). Each Pwell 112a, 112b can specifically have all bottom and side boundaries immediately adjacent to N-type semiconductor material of the Nwell and buried Nwell so as to be electrically isolated form the lower portion of the semiconductor substrate 101 below, as long as the PN-junction diodes formed between the Pwell(s) and the adjacent Nwell and buried Nwell remain reverse biased. Those skilled in the art will recognize that a reverse biased diode is non-conductive due to a negative voltage on the anode (P-type region) and a positive voltage on the cathode (N-type region), whereas a forward biased diode is conductive due to a positive voltage on the anode and a negative voltage on the cathode.

For purposes of illustration, the structure 100 is described and illustrated in the figures as including two Pwells 112a and 112b within the semiconductor substrate 101. It should be understood that the description and figures are not intended to be limiting. The two Pwells 112a and 112b are included to illustrate that, due to Pwell isolation, different biasing conditions can optionally be employed on different Pwells, as discussed in greater detail below. Alternatively, the structure 100 could include only a single Pwell, multiple Pwells electrically connected to receive the same bias voltage, multiple Pwells electrically connected to receive different bias voltages (as illustrated), etc.

The structure 100 can further include semiconductor-on-insulator regions (e.g., SOI regions). Each semiconductor-on-insulator region can include an insulator layer 102 on the top surface of the semiconductor substrate 101. Thus, within the semiconductor substrate 101, all well regions (e.g., Pwells 112a and 112b and Nwell 113) will be immediately adjacent to the insulator layer 102. The insulator layer 102 can be, for example, a thin silicon dioxide layer or a relatively thin layer of any other suitable insulator material. Each semiconductor-on-insulator region can include a thin semiconductor layer 106 on insulator layer 102. The semiconductor layer 106 can be, for example, a monocrystalline silicon layer or a layer of any other suitable monocrystalline semiconductor material (e.g., silicon germanium, etc.).

Within each semiconductor-on-insulator region, the semiconductor layer 106 can further include isolation structures 105. Isolation structures 105 can be, for example, shallow trench isolation (STI) structures including trenches, which extend vertically through the semiconductor layer 106 to or through the insulator layer 102, and which are filled with one or more layers of isolation material (e.g., silicon dioxide, silicon nitride, silicon oxynitride, or any other suitable isolation material). Alternatively, the isolation structures 105 can be any other suitable type of isolation structure (e.g., a diffusion break structure). In any case, the isolation structures 105 can, for example, define the boundaries of front end of the line (FEOL) device regions and provide isolation between the FEOL device regions. The FEOL device regions can include, for example, active device regions 110 for transistors (e.g., field effect transistors (FETs)) including both P-type transistors (e.g., P-channel field effect transistors (PFETs) 152, 162 and/or 172, as discussed below) and N-type transistors (e.g., N-channel field effect transistors (NFETs) 151, 161 and/or 171, as discussed below).

Each FET can further include, within its active device region 110 in the semiconductor layer 106, a channel region (C) between source and drain regions (S/D). In PFETs 152, 162 and/or 172, the source/drain regions can have P-type conductivity at a relatively high conductivity level (e.g., can be P+ source/drain regions) and the channel region can be either intrinsic (i.e., undoped) or can have N-type conductivity at a relatively low conductivity level (e.g., can be an N-channel region). In NFETs 151, 161 and/or 171, the source/drain regions can have N-type conductivity at a relatively high conductivity level (e.g., can be N+ source/drain regions) and the channel region can be either intrinsic (i.e., undoped) or can have P-type conductivity at a relatively low conductivity level (e.g., can be a P-channel region).

Each FET can further include a primary gate (also referred to herein as a front gate) adjacent to (e.g., above, and immediately adjacent to) the active device region at the channel region. Those skilled in the art will recognize that, in a field effect transistor (FET), a gate (also referred to as a gate structure) can include a gate dielectric layer (including one or more layers of gate dielectric material) immediately adjacent to the channel region and a gate conductor layer (including one or more layers of gate conductor material) on the gate dielectric layer. In each transistor, the primary gate can include at least a relatively thin gate dielectric layer immediately adjacent to the top surface of semiconductor layer 106 at the channel region and a gate conductor layer on the gate dielectric layer. The primary gate could be any of gate-first polysilicon gate structures, gate-first high-K metal gate (HKMG) structures, gate-last HKMG structures (also referred to as a replacement metal gate (RMG) structure), or any other suitable type of gate structures. Optionally, the primary gates of the PFETs can include different gate materials than the primary gates of the NFETs and, thus, can have different work functions. Gate sidewall spacers can further be positioned laterally adjacent to sidewalls of the primary gates (e.g., to electrically isolate the gate structure from adjacent S/D regions).

Each FET can further include a secondary gate (also referred to herein as a back gate) adjacent to (e.g., below, and immediately adjacent to) the active device region 110 opposite the primary gate. The secondary gate can include adjacent portions of the insulator layer 102 and the Pwell 112a or 112b or Nwell 113 below.

The structure 100 can further include bulk regions (also referred to as hybrid regions). These regions can be devoid of the insulator layer 102 and instead can include one or more P-type well contact regions 114a, 114b (also referred to herein as Ptaps) on the semiconductor substrate 101 immediately adjacent to each Pwell 112a, 112b and one or more N-type well contact regions 115 (also referred to herein Ntaps) on the semiconductor substrate 101 immediately adjacent the Nwell 113. The Ptaps 114a, 114b and Ntaps 115 are electrically isolated from the active device regions 110 of any FETs (e.g., 151-152, 161-162, 171-172) by isolation structures 105. The Ptaps 114a-114b and Ntaps 115 can include, for example, epitaxially grown monocrystalline semiconductor layers (e.g., epitaxially grown silicon layers or epitaxially grown layers of any other suitable semiconductor material) on the top surface of the semiconductor substrate 101 immediately adjacent to the Pwells 112a and 112b and Nwell 113, respectively. Each Ptap 114a-114b can be doped (e.g., in situ or subsequently implanted) so as to have the P-type conductivity, optionally at a higher conductivity level than the Pwells 112a and 112b below. Each Ntap 115 can be doped (e.g., in situ or subsequently implanted) so as to have the N-type conductivity, optionally at a higher conductivity level than the Nwell 113 below. Optionally, Ptaps and/or Ntaps can further include silicide layers thereon (not shown).

Generally, fully depleted semiconductor-on-insulator structures (e.g., FDSOI structures) that include both semiconductor-on-insulator regions with semiconductor-on-insulator PFETs and/or NFETs and bulk regions with well taps to in-substrate Pwells and/or Nwells are well known in the art and can have various configurations. Thus, the details of the FETs, wells, and well taps and the processing techniques employed to form them (e.g., conventional FDSOI processing techniques) have been omitted from the specification and drawings in order to allow the reader to focus on the salient aspects of the disclosed embodiments as discussed in greater detail below (e.g., related to placement, shapes and biasing of Pwells and/or Nwells within a semiconductor substrate below PFETs and/or NFETs and above the same buried; related to circuits formed thereon, etc.).

More specifically, in the structure 100, Nwell 113 can be electrically connected (via Ntaps 115) to receive a first bias voltage (VNW). VNW can be a positive bias voltage. For example, VNW can be lower than, equal to, or higher than the positive supply voltage (VDD) for the structure 100.

Each Pwell can be electrically connected to receive a second bias voltage that is less than the first bias voltage. For example, in some embodiments, Pwell 112a can be electrically connected (via Ptap 114a) to receive a second bias voltage (VPW1) and, particularly, a second positive bias voltage that is at some voltage level between 0.0V and VNW (i.e., 0.0V<VPW1<VNW). Since VPW1 is less than VNW, the PN junctions between the Pwell 112a and the Nwell 113 and buried Nwell 111 remain reverse biased. In some embodiments, Pwell 112b can be electrically connected (via Ptap 114b) to receive a second bias voltage (VPW2) and, particularly, a negative bias voltage (i.e., VPW2≤0.0V). Since VPW2 is negative, the PN junctions between the Pwell 112b and the Nwell 113 and buried Nwell 111 remain reverse biased.

In some embodiments, the structure 100 can include a first mixed threshold voltage region 150 including at least one NFET 151 and at least one PFET 152 on the insulator layer 102 aligned above the Nwell 113 (which as mentioned above is electrically connected to receive VNW and, particularly, a positive bias voltage). Any NFET 151 above the Nwell 113 is an LVT/SLVT NFET, which is forward back biased (FBB) due to VNW (which is positive) on the Nwell 113. Any PFET 152 above the Nwell 113 is an RVT/HVT PFET, which is reverse back biased (RBB) again due to VNW (which is positive) on the Nwell 113. In other words, the NFET(s) 151 and PFET(s) 152 not only have mixed threshold voltages (i.e., LVT/SLVT and RVT/HVT, respectively), but also different types of back biasing (i.e., FBB and RBB, respectively).

Additionally, or alternatively, the structure 100 can include a second mixed threshold voltage region 160 including at least one NFET 161 and at least one PFET 162 on the insulator layer 102 aligned above the Pwell 112a (which as mentioned above is electrically connected to receive VPW1 and, particularly, a positive bias voltage that is at a lesser voltage level than VNW). Any NFET 161 above the Pwell 112a is an RVT/HVT NFET, which is FBB due to VPW1 (which is positive) on the Pwell 112a. Any PFET 162 above the Pwell 112a is an LVT/SLVT PFET, which RBB due to VPW1 (which is positive) on the Pwell 112a. In other words, the NFET(s) 161 and PFET(s) 162 not only have mixed threshold voltages (i.e., RVT/HVT NFETs and LVT/SLVT PFETs), but also different types of back biasing (i.e., FBB NFETs and RBB PFETs).

Additionally, or alternatively, the structure 100 can include a third mixed threshold voltage region 170 including at least one NFET 171 and at least one PFET 172 on the insulator layer 102 aligned above the Pwell 112b (which as mentioned above is electrically connected to receive VPW2 and, particularly, a negative bias voltage). Any NFET 171 above the Pwell 112b is an RVT/HVT NFET, which is RBB due to VPW2 (which is negative) on the Pwell 112b. Any PFET 172 above the Pwell 112b is an LVT/SLVT PFET, which FBB due to VPW2 (which is negative) on the Pwell 112b. In other words, the NFET(s) 171 and PFET(s) 172 not only have mixed threshold voltages (i.e., RVT/HVT NFETs and LVT/SLVT PFETs), but also different types of back biasing (i.e., RBB NFETs and FBB PFETs).

By providing NFETs and PFETS with mixed threshold voltage and different types of back biasing conditions over the same unbroken buried Nwell 111, the structure 100 is area-efficient. Furthermore, structure 100 can incorporate one or more circuits that include such NFETs and PFETS with mixed threshold voltage and different types of back biasing conditions for optimized performance.

Figure 2:
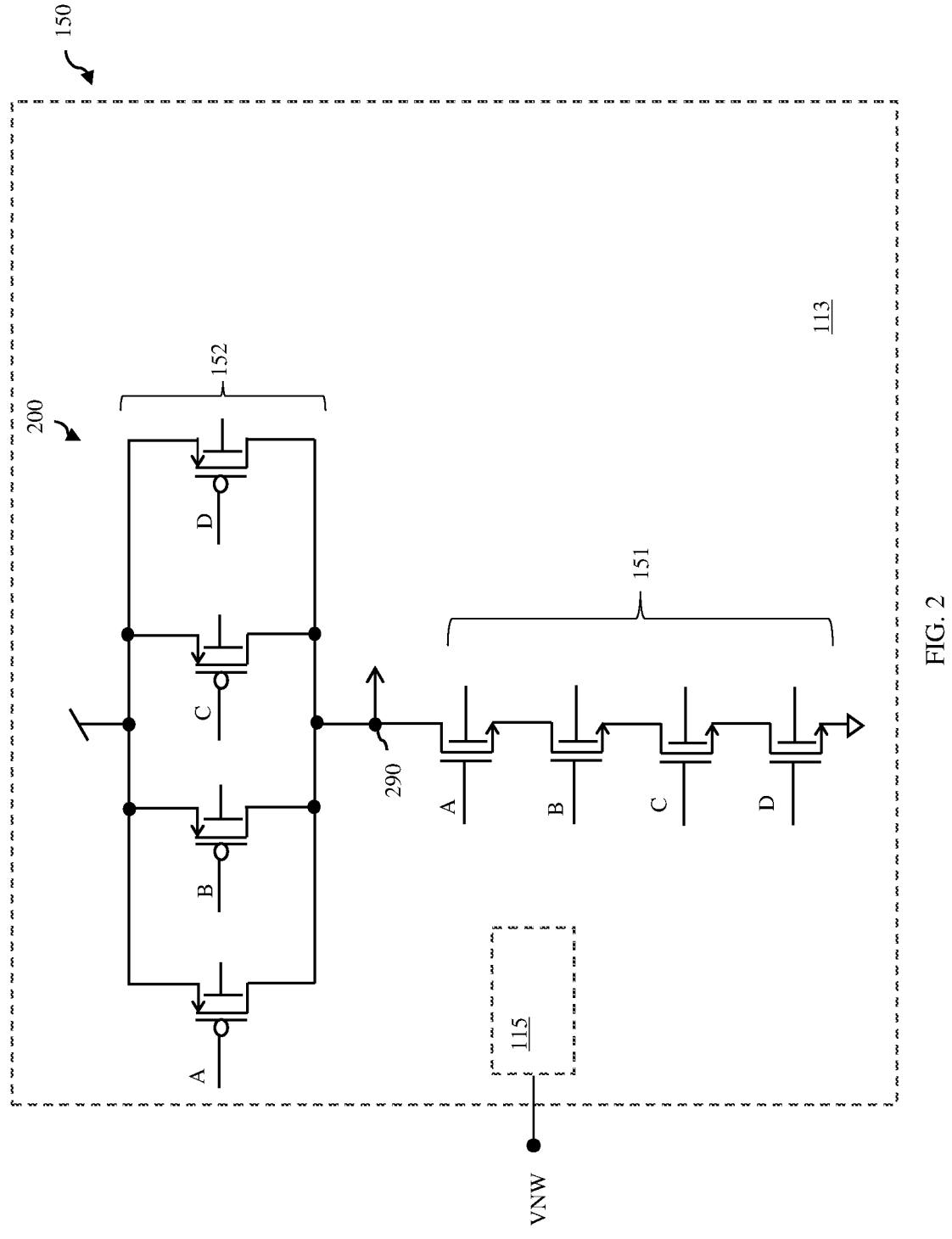
FIG. 2 is a schematic diagram of a NAND gate that can be incorporated into the structure of FIG. 1.

Referring to FIG. 2, a NAND gate 200 is one example of a circuit that can be incorporated into the structure 100. As illustrated, the NAND gate 200 can include a first section with multiple (e.g., two or more) parallel-connected PFETs connected between a positive supply voltage (VDD) and an output node 290 (according to a conventional NAND gate truth table). The NAND gate 200 can further a second section with multiple (e.g., two or more) series-connected NFETs electrically connected between the output node 290 and ground. The gate of each PFET can receive a different input A, B, etc. The gates of the NFETs can receive the same inputs, respectively. Operation of the first section in response to the inputs in combination with operation of the second section in response to the inputs, results in a digital output signal at the output node 290. Therefore, ideally any delay in operation of the first section will be equal to delay in operation of the second section for optimal performance. However, due to the parallel-connection between the PFETs in the first section and the series-connection of the NFETs in the second section, the delay in operation of the first section will be less than that of the second section.

In a conventional FDSOI structure, the NAND gate would be on either a regular well area or a flip well area. Thus, it would have either all FBB LVT/SLVT PFETs and NFETs or all RBB RVT/HVT PFETs and NFETs. As a result, back biasing would not lessen the delay differential. Additionally, if the NAND gate were to have a relatively large number of stacked FETs, it may not operate reliably at lower voltages. However, referring to FIG. 2 in combination with FIG. 1, in the disclosed embodiments, the NAND gate 200 could be formed on the insulator layer 102 in the first mixed threshold voltage region 150 above the Nwell 113 (which is connected to receive VNW, a positive bias voltage). In this case, the parallel-connected PFETs can be PFETs 152 (which, as described above, are RBB RVT/HVT PFETs) and the series-connected NFETs can be NFETs 151 (which, as described above, are FBB LVT/SLVT NFETs). By incorporating parallel-connected RBB RVT/HVT PFETs 152 and series-connected FBB LVT/SLVT NFETs 151 into the NAND gate 200, operational delay of the first section is increased and operational delay of the second section is decreased. That is, operational delay of the two sections of the NAND gate 200 can be balanced for a desired performance level. Furthermore, even if the NAND gate 200 has a relatively large number of stacked FETS, it will operate reliably at lower voltages.

Figure 3:
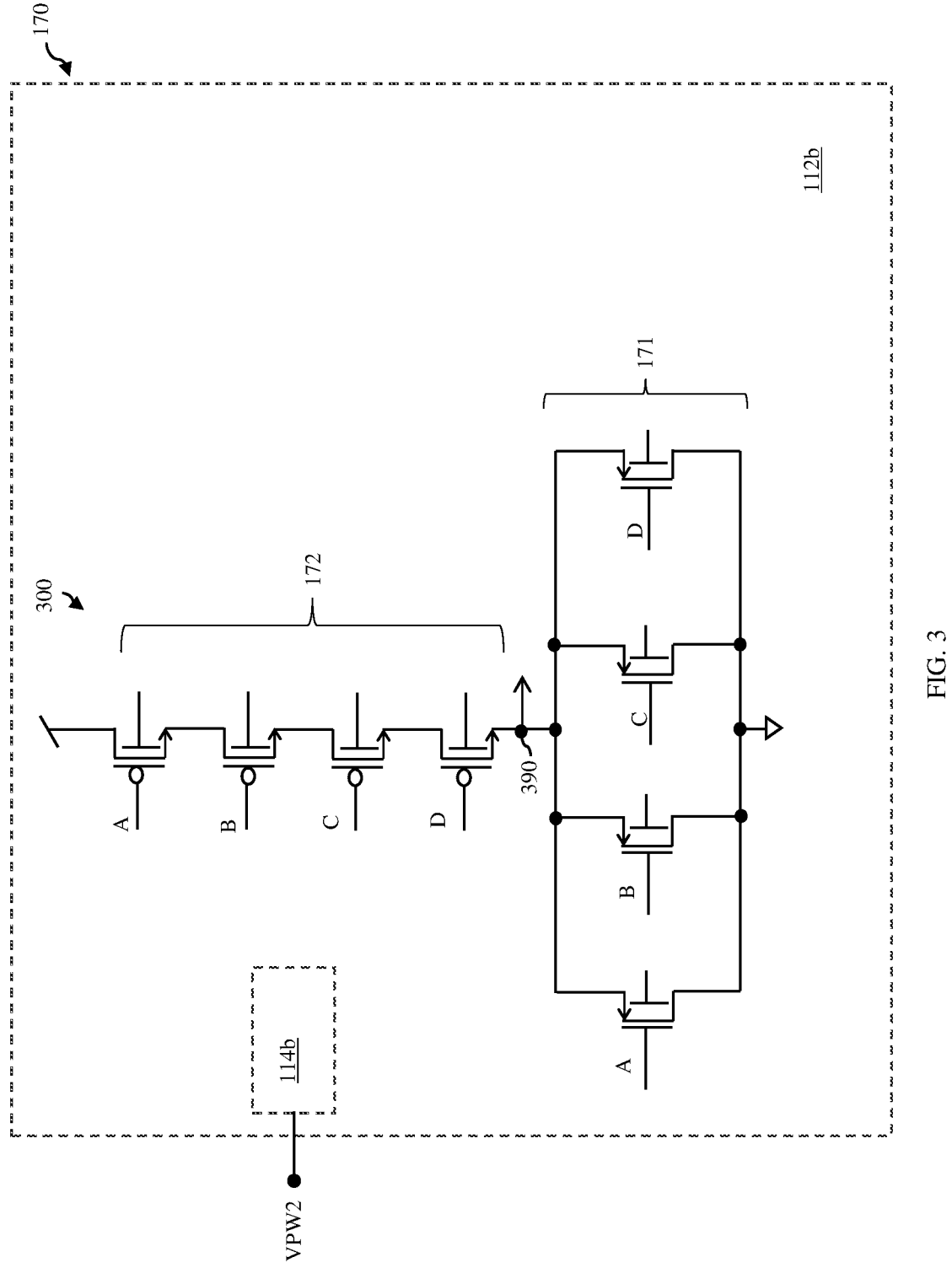
FIG. 3 is a schematic diagram of a NOR gate that can be incorporated into the structure of FIG. 1.

Referring to FIG. 3, a NOR gate 300 is another example of a circuit that can be incorporated into the structure 100. As illustrated, the NOR gate 300 can include a first section with multiple (e.g., two or more) series-connected PFETs connected between a positive supply voltage (VDD) and an output node 390. The NOR gate 300 can further a second section with multiple (e.g., two or more) parallel-connected NFETs electrically connected between the output node 390 and ground. The gate of each PFET can receive a different input A, B, etc. The gates of the NFETs can receive the same inputs, respectively. Operation of the first section in response to the inputs in combination with operation of the second section in response to the inputs, results in a digital output signal at the output node 390 (according to a conventional NOR gate truth table). Therefore, ideally any delay in operation of the first section will be equal to delay in operation of the second section for optimal performance. However, due to the series-connection between the PFETs in the first section and the parallel-connection of the NFETs in the second section, the delay in operation of the first section will be greater than that of the second section.

In a conventional FDSOI structure, a NOR gate would be on either a regular well area or a flip well area. Thus, it would have either all FBB LVT/SLVT PFETs and NFETs or all RBB RVT/HVT PFETs and NFETs. As a result, back biasing would not lessen the delay differential. Additionally, if the NOR gate were to have a relatively large number of stacked FETs, it may not operate reliably at lower voltages. However, referring to FIG. 3 in combination with FIG. 1, in the disclosed embodiments, the NOR gate 300 could be formed on the insulator layer 102 in the third mixed threshold voltage region 170 above the Pwell 112*b* (which is connected to receive VPW2, a negative bias voltage). In this case, the series-connected PFETs can be PFETs 172 (which, as described above, are FBB LVT/SLVT PFETs) and the parallel-connected NFETs can be NFETs 171 (which, as described above, are RBB RVT/HVT NFETs). By incorporating series-connected FBB LVT/SLVT PFETs 172 and parallel-connected RBB RVT/HVT NFETs 171 into the NOR gate 300, operational delay of the first section is decreased and operational delay of the second section is increased. That is, operational delay of the two sections of the NOR gate 300 can be balanced for optimal performance. Furthermore, even if the NOR gate 200 has a relatively large number of stacked FETS, it will operate reliably at lower voltages.

Figure 4:
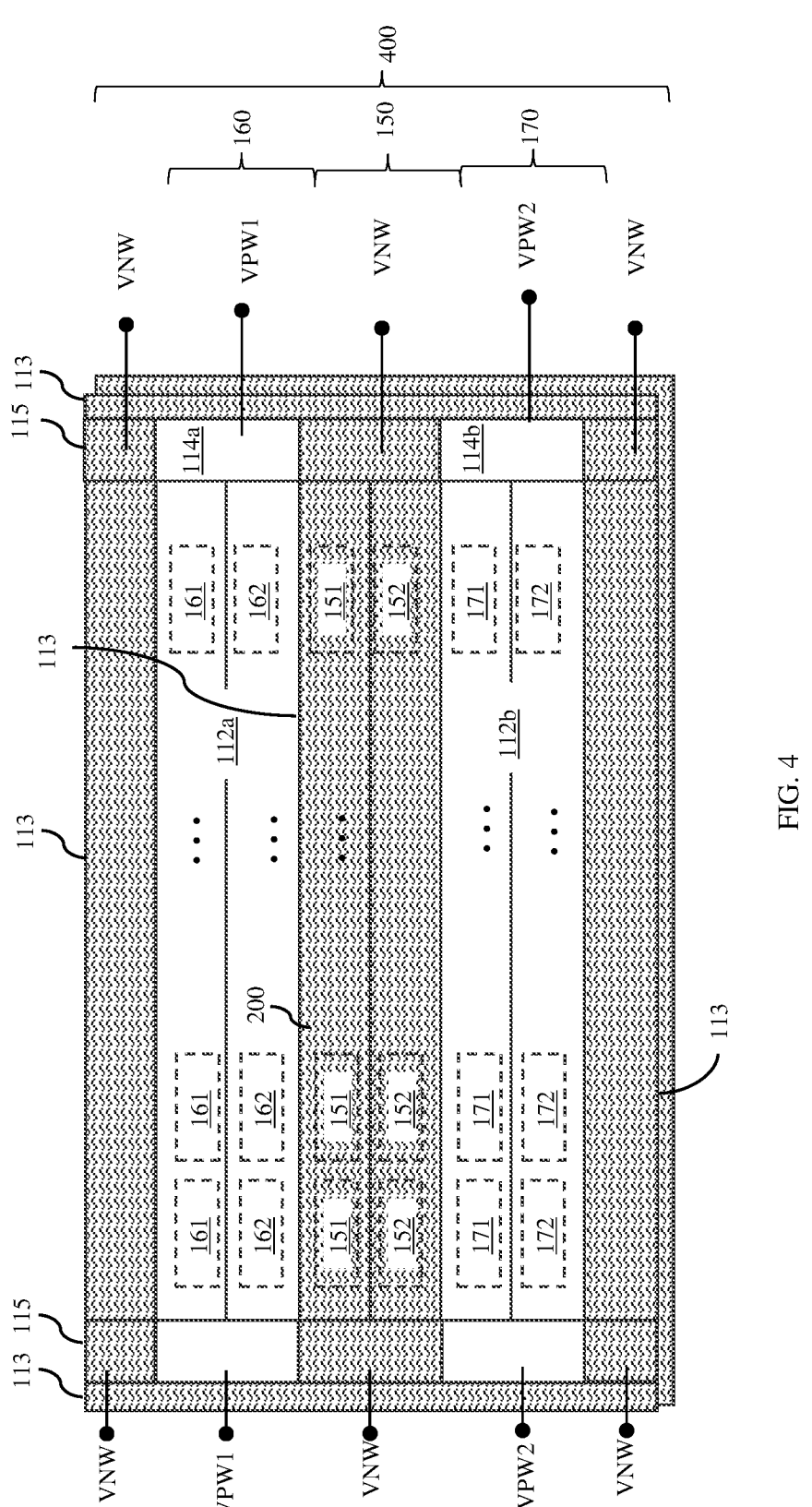
FIG. 4 is a diagram illustrating an example of a novel layout for the structure of FIG. 1.

FIG. 4 is a diagram illustrating an example of a novel layout 400 of well regions and FETs that could be employed for the structure 100 of FIG. 1. As illustrated in the layout 400, the structure can include multiple well regions within a semiconductor substrate including an Nwell 113 for a first mixed threshold voltage region 150 and Pwell(s) 112*a*, 112*b* laterally surrounded by the Nwell 113 for second mixed threshold voltage region 160 and/or third mixed threshold voltage region 170. The Pwell(s) 112*a*, 112*b* can be elongated essentially rectangular shaped regions positioned laterally between similarly elongated portions of the Nwell 113. The structure can further include a buried Nwell 111 in the semiconductor substrate below the multiple well regions 112*a*, 112*b*, 113. The structure can further include, for example, two rows of FETs on the insulator layer above each of Pwell and above the portion of the Nwell adjacent to or between the Pwells. These two rows of FETs above can include a row of PFETs and a row of NFETs. For example, for the first mixed threshold voltage region 150, a row of NFETs 151 and a row of PFETs 152 can be above the Nwell 113 biased at VNW. Optionally, at least some of the NFETs 151 and PFETs 152 can be electrically connected to form the NAND gate 200. Additionally, or alternatively, for a second mixed threshold voltage region 160, a row of NFETs 161 and a row of PFETs 162 can be above the Pwell 112*a* biased at VPW1 (e.g., 0.0V<VPW1<VNW). Additionally, or alternatively, for a third mixed threshold voltage region 170, a row of NFETs 171 and a row of PFETs 172 can be above the Pwell 112*b* biased at VPW2 (e.g., VPW2<0.0V<VNW). Optionally, at least some of the NFETs 171 and PFETs 172 can be electrically connected to form the NOR gate 300. Thus, in such a layout 400, there are alternating rows of PFETs and NFETs. It should be understood that to avoid clutter in the figures and to allow the reader to focus on the salient aspects of the structure related to the well regions and FETs above the well regions, all of the components of the structure 100 as described above and illustrated in FIG. 1 are not further illustrated in the example layout of FIG. 4.

Those skilled in the art will recognize that in a typical FDSOI chip structure layout multiple rows of FETs will be above the insulator layer aligned above each well region and the rows of FETs above a given well region will have the same type conductivity. For example, in a flip well configuration, rows of NFETs will be on the insulator layer above the Nwell only and rows of PFETs will be on the insulator layer above Pwells only; whereas in a regular well configuration, rows of NFETs will be on the insulator layer above the Pwells only and rows of PFETs will be on the insulator layer above the Nwell only. Thus, there will typically be alternating pairs of rows of PFETs and pairs of rows of NFETs.

Figure 5:
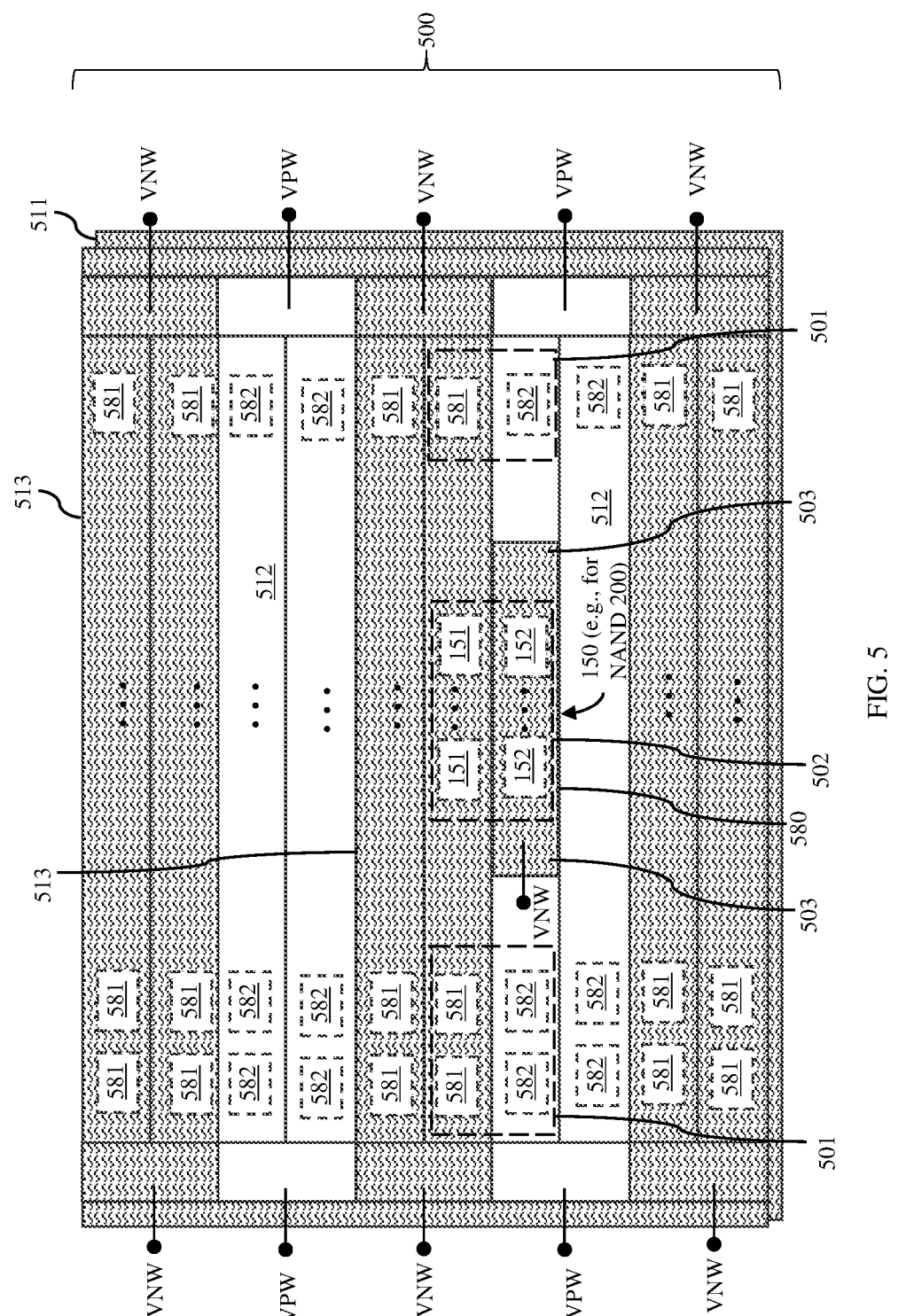
FIGS. 5 and 6 are diagrams illustrating alternative examples of layouts for the structure of FIG. 1.
Figure 6:
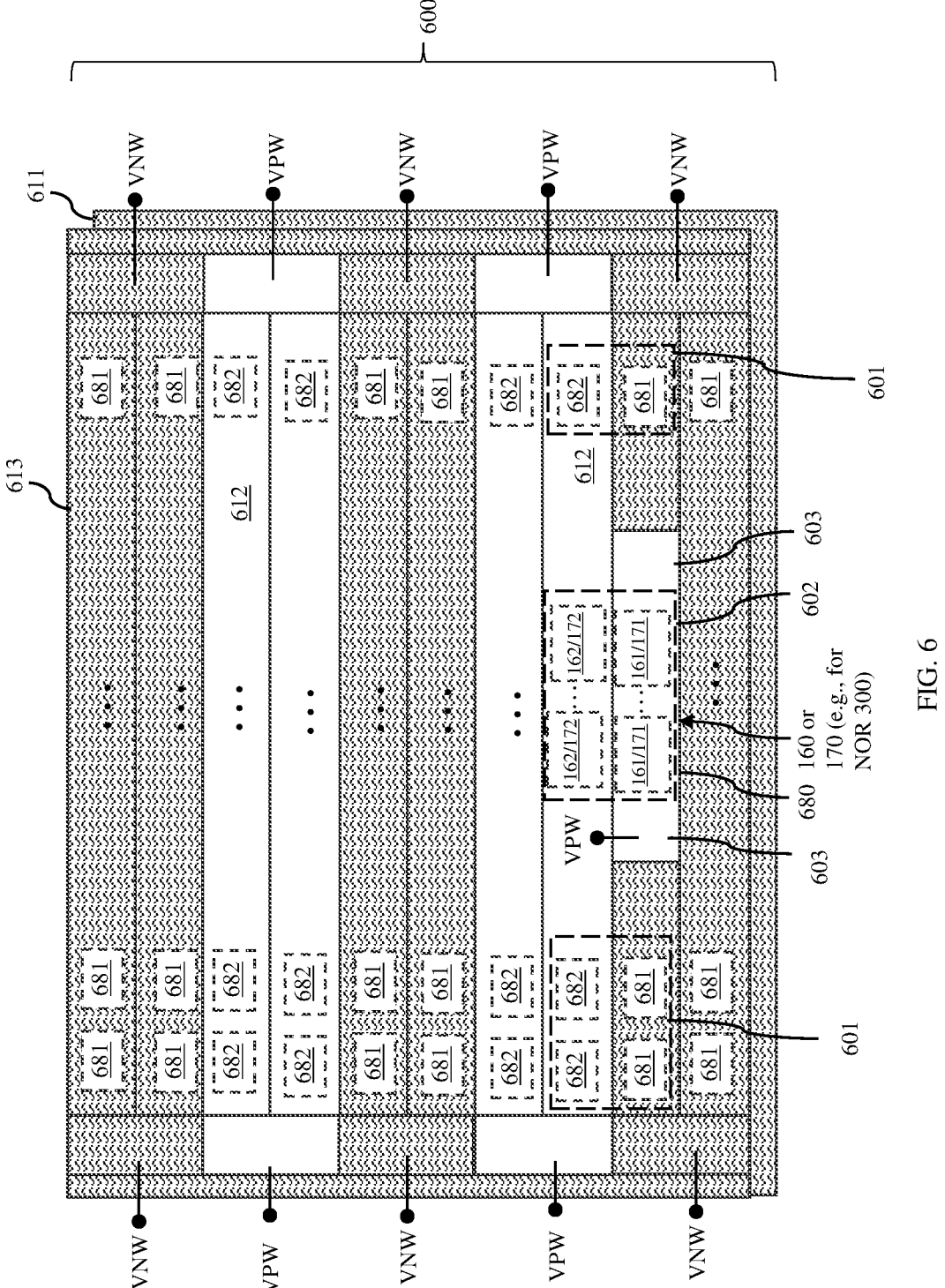

In the disclosed embodiments, instead of laying out the structure 100 in a completely new manner with alternating single rows of PFETs and NFETs (e.g., as in the layout 400 of FIG. 4), a conventional standard cell layout can be modified to include one or more well extensions 580, 680, as shown in the example layouts 500, 600 of FIGS. 5 and 6.

More specifically, FIGS. 5 and 6 are diagrams illustrating example layouts 500 and 600. As illustrated in these example layouts 500, 600, the structure 100 can include multiple well regions within a semiconductor substrate. The well regions can include an Nwell 513, 613 and one or more Pwells 512, 612 laterally surrounded by the Nwell 513, 613. The Pwell(s) 512, 612 can be elongated essentially rectangular shaped regions positioned laterally between similarly elongated portions of the Nwell 513, 613. The structure can further include a buried Nwell 511, 611 in the semiconductor substrate below the multiple well regions 512-513, 612-613. The structure can further include two rows of FETs on the insulator layer above each of Pwell 512 and above the portion of the Nwell 513 adjacent to or between the Pwell(s). Generally, the rows of FETs above each Pwell 512, 612 will have the same type conductivity and the rows of FETs above the Nwell will have a different type conductivity than the rows of FETs above the Pwells 512, 612. For example, in some embodiments, rows of NFETs 581, 681 can be above the Nwell 513, 613 and rows of PFETs 582, 682 can be above the Pwells 512, 612. In this case, standard cell areas 501 will include a row of one or more NFETs 581, 681 on an Nwell 513, 613 and a row of one or more PFETs 582, 682 on an immediately adjacent Pwell 512, 612. However, to achieve any of the mixed threshold voltage regions 150, 160 or 170 of the structure 100, as described above, one or more of the well regions can include well extensions 580, 680, which extend laterally from one well region into the immediately adjacent well region in order to form a modified cell area 502, 602 positioned laterally between transitions areas 503, 603. It should be understood that a well extension will have the same type conductivity as the well from which it extends and will have a different type conductivity than the adjacent will region into which it extends.

For example, referring specifically to the example layout 500 of FIG. 5, an Nwell extension 580 of the Nwell 513 can extend laterally partially into the adjacent Pwell 512 so that a modified cell area 502 includes one or more NFETs 151 that are formed concurrently and in the same row as NFETs 581 in adjacent standard cell areas 501 over an Nwell 513 and one or more PFETs 152 that are formed concurrently and in the same row as PFETs 582 in the adjacent standard cell areas 501 but above the Nwell extension 580 as opposed to being above the Pwell 512. The Nwell extension 580 can be tapped (i.e., can have an Ntap thereon) so as to be electrically connected to receive the same bias voltage (i.e., VNW) used to bias the Nwell 513 itself. Thus, the first mixed threshold voltage region 150 can include one or more NFETs 151 (which are within the row of NFETs 581 formed on the Nwell 513) and can further include one or more PFETs 152 (which are within the row of PFETs 582 but formed over the Nwell extension 580). As discussed in greater detail above, in the first mixed threshold voltage region 150, a NAND gate 200 can include both RBB RVT/HVT PFETs 152 and FBB LVT/SLVT NFETs 151 for optimal performance.

Also, for example, referring specifically to the example layout 600 of FIG. 6, a Pwell extension 680 of a Pwell 612 can extend laterally partially into the adjacent portion of the Nwell 613 so that a modified cell area 602 includes one or more PFETs 162 or 172 that are formed concurrently and in the same row as PFETs 682 in adjacent standard cell areas 601 above a Pwell 612 and one or more NFETs 161 or 171 that are formed concurrently and in the same row as NFETs 681 in the adjacent standard cell areas 601 but above the Pwell extension 680 as opposed to being above the Nwell 613. The Pwell extension 680 can be tapped (i.e., can have a Ptap thereon) so as to be electrically connected to receive the same bias voltage (VPW) as the Pwell 612. It should be understood that, as discussed in detail above, NFETs 161 and 171 and PFETs 162 and 172 are simply distinguishable by the Pwell bias voltage (VPW) employed. In some embodiments, VPW can be equal to VPW1, which is a positive bias voltage less than VNW to achieve the second mixed threshold voltage region 160 described above With Alternatively, VPW can be equal to VPW2, which is a negative bias voltage to achieve the third mixed threshold voltage region 170 described above. In either case, the modified cell areas 502, 602 include a mixed threshold voltage region 160, 170 with one or more PFETs 162, 172 (which are within the row of PFETs 682 formed on the Pwell 612) and with one or more NFETs 161, 171 (which are within the row of NFETs 681 but formed over the Pwell extension 680). As discussed in greater detail above, the second mixed threshold voltage region 160 will include RBB LVT/SLVT PFETs 162 and FBB RVT/HVT NFETs 161, whereas the third mixed threshold voltage region 170 will include RBB RVT/HVT NFETs 171 and FBB LVT/SLVT PFETs 172. Additionally, in the third mixed threshold voltage region 170, an NOR gate 300 can include both RBB RVT/HVT NFETs 171 and FBB LVT/SLVT PFETs 172 for optimal performance.

It should be understood that in the structures and method described above, a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
an insulator layer on a semiconductor substrate;
multiple well regions in the semiconductor substrate adjacent to the insulator layer and including:
an Nwell;
a Pwell laterally surrounded by the Nwell;
an additional Nwell in the semiconductor substrate below the multiple well regions; and
P-channel and N-channel field effect transistors on the insulator layer above at least one of the multiple well regions,
wherein the Nwell is electrically connected to receive a first bias voltage and the Pwell is electrically connected to receive a second bias voltage that is lower than the first bias voltage.

2. The structure of claim 1,
wherein the first bias voltage is a positive bias voltage,
wherein the P-channel and N-channel field effect transistors are on the insulator layer above the Nwell,
wherein each P-channel field effect transistor on the Nwell is one of a regular threshold voltage transistor and a high threshold voltage transistor reverse back biased by the positive bias voltage, and
wherein each N-channel field effect transistor on the Nwell is one of a low threshold voltage transistor and a super low threshold voltage transistor forward back biased by the positive bias voltage.

3. The structure of claim 2, wherein the P-channel and N-channel field effect transistors include multiple parallel-connected P-channel field effect transistors and multiple series-connected N-channel field effect transistors electrically connected and forming a NAND gate.

4. The structure of claim 1,
wherein the first bias voltage is a first positive bias voltage and the second bias voltage is a second positive bias voltage less than the first positive bias voltage,
wherein the P-channel and N-channel field effect transistors are on the insulator layer above the Pwell,
wherein each P-channel field effect transistor on the Pwell is one of a low threshold voltage transistor and a super low threshold voltage transistor reverse back biased by the second positive bias voltage, and
wherein each N-channel field effect transistor above the Pwell is one of a regular threshold voltage transistor and a high threshold voltage transistor forward back biased by the second positive bias voltage.

5. The structure of claim 1,
wherein the first bias voltage is a positive bias voltage and the second bias voltage is a negative bias voltage,
wherein the P-channel and N-channel field effect transistors are on the insulator layer above the Pwell,
wherein each P-channel field effect transistor on the Pwell is one of a low threshold voltage transistor and a super low threshold voltage transistor forward back biased by the negative bias voltage, and
wherein each N-channel field effect transistor on the Pwell is one of a regular threshold voltage transistor and a high threshold voltage transistor reverse back biased by the negative bias voltage.

6. The structure of claim 5, wherein the P-channel and N-channel field effect transistors include multiple parallel-connected N-channel field effect transistors and multiple series-connected P-channel field effect transistors electrically connected and forming a NOR gate.

7. The structure of claim 1,
wherein the multiple well regions include multiple Pwells laterally surrounded by the Nwell,
wherein the structure further comprises groups of P-channel and N-channel field effect transistors on the insulator layer above each of the multiple well regions, and
wherein the Pwells are electrically connected to receive a same second bias voltage.

8. The structure of claim 1,
wherein the multiple well regions include multiple Pwells laterally surrounded by the Nwell,
wherein the structure further comprises groups of P-channel and N-channel field effect transistors on the insulator layer above each of the multiple well regions, and
wherein the Pwells are electrically connected to receive at least two different second bias voltages.

9. A structure comprising:
an insulator layer on a semiconductor substrate;
multiple well regions in the semiconductor substrate adjacent to the insulator layer and including:
an Nwell;
a Pwell laterally surrounded by the Nwell;
an additional Nwell in the semiconductor substrate below the multiple well regions; and
rows of field effect transistors on the insulator layer and including, above each well region, a row of P-channel field effect transistors and a row of N-channel field effect transistors,
wherein the Nwell is electrically connected to receive a first bias voltage, and
wherein the Pwell is electrically connected to receive a second bias voltage that is lower than the first bias voltage.

10. The structure of claim 9,
wherein the first bias voltage is a positive bias voltage,
wherein each P-channel field effect transistor above the Nwell is one of a regular threshold voltage transistor and a high threshold voltage transistor reverse back biased by the positive bias voltage, and
wherein each N-channel field effect transistor above the Nwell is one of a low threshold voltage transistor and a super low threshold voltage transistor forward back biased by the positive bias voltage.

11. The structure of claim 10, wherein, above the Nwell, the P-channel and N-channel field effect transistors include multiple parallel-connected P-channel field effect transistors and multiple series-connected N-channel field effect transistors electrically connected and forming a NAND gate.

12. The structure of claim 9,
wherein the first bias voltage is a first positive bias voltage and the second bias voltage is a second positive bias voltage less than the first positive bias voltage,
wherein each P-channel field effect transistor above the Pwell is one of a low threshold voltage transistor and a super low threshold voltage transistor reverse back biased by the second positive bias voltage, and
wherein each N-channel field effect transistor above the Pwell is one of a regular threshold voltage transistor and a high threshold voltage transistor forward back biased by the second positive bias voltage.

13. The structure of claim 9,
wherein the first bias voltage is a positive bias voltage and the second bias voltage is a negative bias voltage,
wherein each P-channel field effect transistor above the Pwell is one of a low threshold voltage transistor and a super low threshold voltage transistor forward back biased by the negative bias voltage, and
wherein each N-channel field effect transistor above the Pwell is one of a regular threshold voltage transistor and a high threshold voltage transistor reverse back biased by the negative bias voltage.

14. The structure of claim 13, wherein, above the Pwell, the P-channel and N-channel field effect transistors include multiple parallel-connected N-channel field effect transistors and multiple series-connected P-channel field effect transistors electrically connected and forming a NOR gate.

15. A structure comprising:
an insulator layer on a semiconductor substrate;
multiple well regions in the semiconductor substrate adjacent to the insulator layer, wherein the multiple well regions include alternating Nwells and Pwells, and wherein at least one well region of the multiple well regions includes an extension extending laterally into an adjacent well region;
an additional Nwell in the semiconductor substrate below the multiple well regions; and
rows of N-channel field effect transistors and P-channel field effect transistors on the insulator layer above the Nwells and the Pwells, respectively,
wherein at least one of:
a row of N-channel field effect transistors includes at least one N-channel field effect transistor on the insulator layer above a P-type extension of a Pwell; and
a row of P-channel field effect transistors includes at least one P-channel field effect transistor on the insulator layer above an N-type extension of an Nwell, wherein the Nwells and any N-type extension thereof are electrically connected to receive a first bias voltage, and
wherein the Pwells and any P-type extension thereof are electrically connected to receive a second bias voltage that is lower than the first bias voltage.

16. The structure of claim 15, wherein the first bias voltage is a positive bias voltage with each P-channel field effect transistor above an N-type extension being one of a regular threshold voltage transistor and a high threshold voltage transistor reverse back biased by the positive bias voltage, and each N-channel field effect transistor above an Nwell being one of a low threshold voltage transistor and a super low threshold voltage transistor forward back biased by the positive bias voltage.

17. The structure of claim 16, further comprising: multiple parallel-connected P-channel field effect transistors are above the N-type extension; and multiple series-connected N-channel field effect transistors are above the Nwell, wherein the multiple parallel-connected P-channel field effect transistors and the multiple series-connected N-channel field effect transistors are electrically connected and form a NAND gate.

18. The structure of claim 15, wherein the first bias voltage is a first positive bias voltage and the second bias voltage is a second positive bias voltage that is lower than the first positive bias voltage with each P-channel field effect transistor above a Pwell being one of a low threshold voltage transistor and a super low threshold voltage transistor reverse back biased by the second positive bias voltage and each N-channel field effect transistor above a P-type extension being one of a regular threshold voltage transistor and a high threshold voltage transistor forward back biased by the second positive bias voltage.

19. The structure of claim 15, wherein the first bias voltage is a positive bias voltage and the second bias voltage is a negative bias voltage with each P-channel field effect transistor above a Pwell being one of a low threshold voltage transistor and a super low threshold voltage transistor forward back biased by the negative bias voltage and each N-channel field effect transistor above a P-type extension being one of a regular threshold voltage transistor and a high threshold voltage transistor reverse back biased by the negative bias voltage.

20. The structure of claim 19, further comprising: multiple parallel-connected N-channel field effect transistors above the P-type extension; and multiple series-connected P-channel field effect transistors above the Pwell, wherein the multiple parallel-connected N-channel field effect transistors and the multiple series-connected P-channel field effect transistors are electrically connected and form an NOR gate.

* * * * *